United States Patent
Lee et al.

(10) Patent No.: US 7,948,482 B2
(45) Date of Patent: May 24, 2011

(54) APPARATUS FOR TESTING DRIVING CIRCUIT FOR DISPLAY

(75) Inventors: Chuan-Che Lee, Tainan County (TW); Jiun-Lang Huang, Taipei (TW); Jui-Jer Huang, Taipei (TW)

(73) Assignees: Himax Technologies Limited, Tainan County (TW); Jiun-Lang Huang, Taipei (TW)

( * ) Notice: Subject to any disclaimer, the term of this patent is extended or adjusted under 35 U.S.C. 154(b) by 797 days.

(21) Appl. No.: 11/942,444

(22) Filed: Nov. 19, 2007

(65) Prior Publication Data

US 2009/0040199 A1    Feb. 12, 2009

(30) Foreign Application Priority Data

Aug. 7, 2007   (TW) .............................. 96129000 A (51) Int. Cl.
   *G06F 3/038*   (2006.01)
   *G09G 5/00*   (2006.01)
(52) U.S. Cl. ........ 345/204; 345/205; 345/206; 345/904; 702/108
(58) Field of Classification Search .......... 345/204–215, 345/904; 702/108–126
See application file for complete search history.

(56) References Cited

U.S. PATENT DOCUMENTS

| | | | | |
|---|---|---|---|---|
| 5,285,152 A | * | 2/1994 | Hunter | 324/73.1 |
| 5,508,958 A | * | 4/1996 | Fazio et al. | 365/185.19 |
| 5,554,986 A | * | 9/1996 | Neidorff | 341/145 |
| 5,610,553 A | * | 3/1997 | Kirn | 330/10 |
| 5,994,916 A | * | 11/1999 | Hayashi | 324/760.02 |
| 6,268,817 B1 | * | 7/2001 | Min et al. | 341/145 |
| 6,518,900 B1 | * | 2/2003 | Oehler et al. | 341/120 |
| 6,633,135 B2 | * | 10/2003 | Nara et al. | 315/169.3 |
| 6,670,904 B1 | * | 12/2003 | Yakovlev | 341/167 |
| 6,753,801 B2 | * | 6/2004 | Rossi | 341/161 |
| 6,870,495 B1 | * | 3/2005 | Zadeh et al. | 341/161 |
| 6,958,720 B1 | * | 10/2005 | Prater | 341/145 |
| 2004/0160351 A1 | * | 8/2004 | Rossi | 341/161 |
| 2006/0012696 A1 | * | 1/2006 | Zarnowski et al. | 348/294 |
| 2007/0030262 A1 | * | 2/2007 | Ambo et al. | 345/204 |

* cited by examiner

*Primary Examiner* — Amare Mengistu
*Assistant Examiner* — Aaron M Guertin
(74) *Attorney, Agent, or Firm* — J.C. Patents (57) ABSTRACT

An apparatus for testing a driving circuit for a display is disclosed. The apparatus includes a selecting circuit, a reference voltage generator and an analog-to-digital converter (ADC). The selecting circuit includes many input terminals and an output terminal. The input terminals are respectively coupled to many output pins of the driving circuit, while the selecting circuit is used for selecting one of the output pins to electrically connect the output terminal of the selecting circuit. The reference voltage generator is coupled to at least one of the output pins for generating a reference voltage. The ADC is coupled to the output terminal of the selecting circuit for outputting a digital value based on a difference between an output voltage outputted from the output terminal of the selecting circuit and the reference voltage produced by the reference voltage generator.

10 Claims, 6 Drawing Sheets

APPARATUS FOR TESTING DRIVING CIRCUIT FOR DISPLAY

CROSS-REFERENCE TO RELATED APPLICATION

This application claims the priority benefit of Taiwan application serial no. 96129000, filed on Aug. 7, 2007. The entirety of the above-mentioned patent application is hereby incorporated by reference herein and made a part of this specification.

BACKGROUND OF THE INVENTION

1. Field of the Invention

The present invention relates to an integrated circuit (IC) testing technology, and more particularly, to an apparatus for testing a driving circuit for a display.

2. Description of Related Art

Flat panel displays, such as liquid crystal displays (LCDs), have been extensively adopted in recent years. The LCDs have advantages of low power consumption, physical compactness, light weight, high resolution, high color saturation, long life time, and so forth. Hence, the LCDs have been widely applied to electronic products closely associated with our daily lives, such as laptop or desktop computers and LCD TVs. Here, a driving circuit in the LCD is a crucial element which drives the LCD, affects display quality of the LCD and the manufacturing costs thereof.

Tests are performed before packaging the driving circuit for the LCD, so as to ensure that the LCD is operated as normal. For example, a chip probe (CP) test may be performed for the driving circuit for the LCD, such as a source driving die. Since an analog voltage outputted by the source driving die should be as accurate as it may be, a precise and expensive analog testing machine is required for inspecting the voltages of the output pins in each of the source driving dies when the CP test is performed on the source driving die.

Nevertheless, the number of output pins in each of the source driving dies increases along with an increasing dimension of an LCD panel in the LCD. As a result, workload arisen from the CP test increases. Hence, developing a fast and inexpensive apparatus for testing in replacement of the conventional expensive analog testing machine is imperative at the moment.

SUMMARY OF THE INVENTION

The present invention is directed to an apparatus for testing a driving circuit for a display, so as to reduce costs of inspecting dies.

The present invention provides an apparatus for testing a driving circuit for a display. The apparatus includes a selecting circuit, a reference voltage generator and an analog-to-digital converter (ADC). The selecting circuit includes a plurality of input terminals and an output terminal. The input terminals are respectively coupled to a plurality of output pins of the driving circuit for the display, and the selecting circuit is used for selecting one of the output pins to electrically connect the output terminal of the selecting circuit. The reference voltage generator is coupled to at least one of the output pins for generating a reference voltage. The ADC is coupled to the selecting circuit and the reference voltage generator for outputting a digital value based on a difference between an output voltage outputted from the output terminal of the selecting circuit and the reference voltage.

According to an embodiment of the present invention, the reference voltage generator is further coupled to a first specific pin and a second specific pin in the output pins for selecting one of the output voltages of the first and the second specific pins as the reference voltage based on polarities of the output voltages of the first and the second specific pins, or for averaging the output voltages of the first and the second specific pins and taking the averaged voltage as the reference voltage.

According to an embodiment of the present invention, the apparatus for testing the driving circuit is disposed on a scribe line of a wafer.

In order to the make the aforementioned and other objects, features and advantages of the present invention comprehensible, several embodiment accompanied with figures are described in detail below.

DESCRIPTION OF EMBODIMENTS

Figure 1:
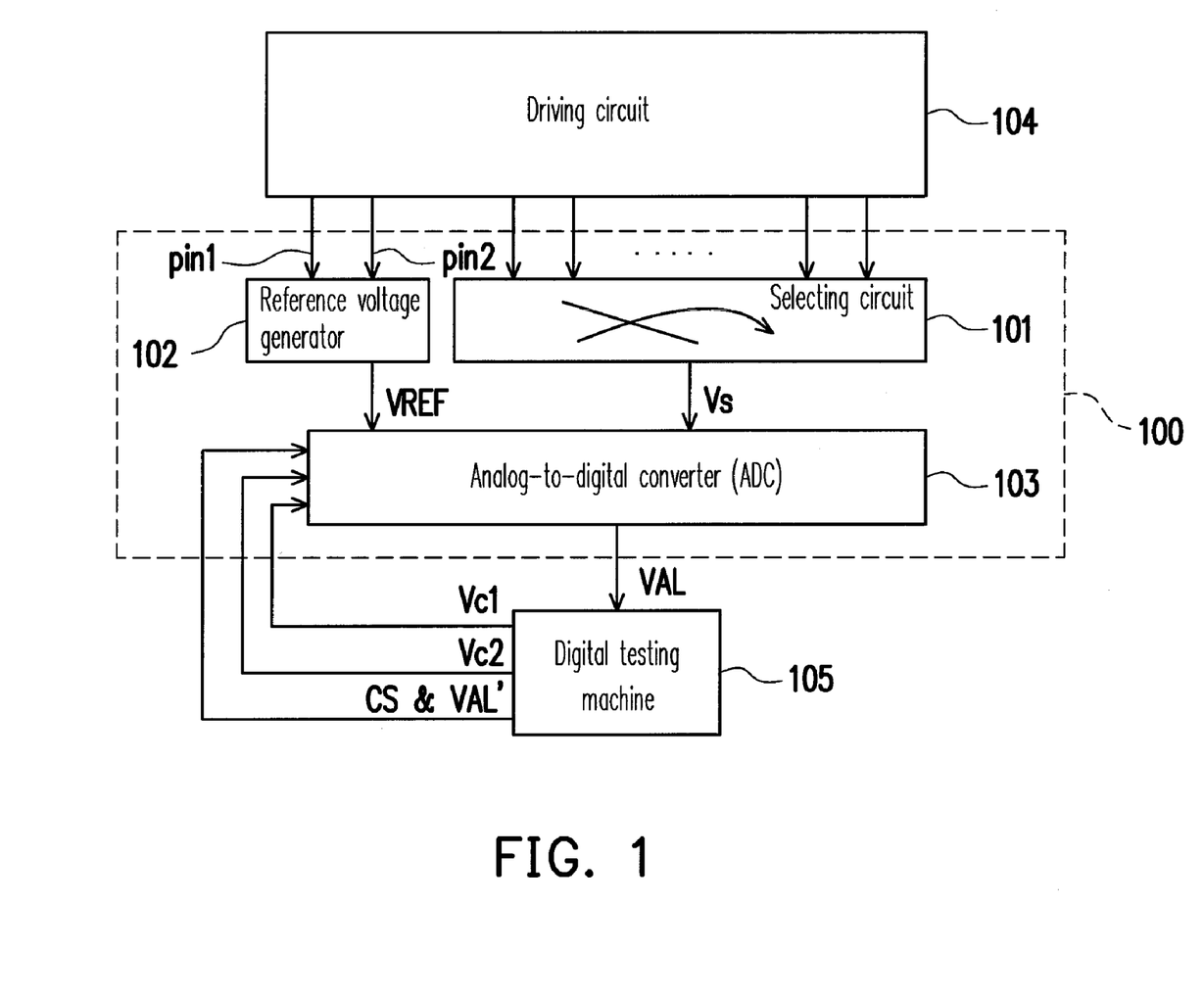
FIG. 1 is a circuit block diagram depicting an apparatus for testing a driving circuit for a display according to an embodiment of the present invention.

FIG. 1 is a circuit block diagram depicting a testing apparatus 100 for a driving circuit used in a display according to an embodiment of the present invention. Referring to FIG. 1, the testing apparatus 100 includes a selecting circuit 101, a reference voltage generator 102 and an ADC 103. In order to better describe the present invention, an under-test driving circuit 104 and a digital testing machine 105 are further illustrated in FIG. 1. Here, it is assumed that the driving circuit 104 is a source driver used by an LCD, while the digital testing machine 105 is adopted for outputting known testing data to the under-test source driver 104. After the under-test source driver 104 receives those known testing data, the testing apparatus 100 receives the outputs from the under-test source driver 104 and outputs a testing result to the digital testing machine 105, such that the digital testing machine 105 is capable of determining whether the under-test source driver 104 is good or not.

Additionally, in the present embodiment, given that an output voltage of the source driver 104 ranges from 0V to 14V and 8 bits of pixel data are received by each channel of the source driver 104, a difference between two driving voltages of two adjacent gray scales is 14V/256=54.7 mV.

According to the present embodiment, as the testing apparatus 100 performs a test, each channel of the source driver 104 receives the same pixel data outputted by the digital testing machine 105. Thus, under an ideal condition, the voltage outputted by each of the channels of the source driver 104 should be the same. For example, if a pixel data of 128 is inputted, the voltage outputted by the output pins of each channel of the source driver 104 should fall in approximately 7V. Moreover, if a pixel data of 64 are inputted, the voltage outputted by each of the output pins of the source driver 104 should fall in approximately 3.5V.

The above assumption merely serves as an explanation of the present invention. That is to say, as a matter of fact, the source driver 104 may not be of a linear-output type, so that the source driver 104 may be further required for proceeding a GAMMA correction or a transmittance correction, and so forth.

In general, not an accuracy of the voltage outputted by the source driver 104 but consistency thereof is the most imperative factor in determining whether the source driver 104 meets the required specification. In other words, when the pixel data is constant, it should be determined if the output voltages of the pins are close to one another.

In the present embodiment, the reference voltage generator 102 is coupled to a first output pin pin1 and a second output pin pin2 of the source driver 104, so as to generate a reference voltage VREF. Generally speaking, the reference voltage generator 102 may, for example, select either the output voltage of the first output pin pin1 or the output voltage of the second output pin pin2 as the reference voltage VREF based on polarities of the output voltages of the first and the second output pins pin1 and pin2. In an alternative, the reference voltage generator 102 may average the output voltages of the first and the second output pins pin1 and pin2 and take the averaged voltage as the reference voltage VREF.

The selecting circuit 101 includes a plurality of input terminals and an output terminal. The input terminals of the selecting circuit 101 are respectively coupled to the output pins of the source driver 104. The selecting circuit 101 is used for selecting one of the output pins of the source driver 104 to electrically connect the output terminal of the selecting circuit 101. The ADC 103 is coupled to the selecting circuit 101 and the reference voltage generator 102 for outputting a digital value VAL based on an output voltage Vs outputted from the output terminal of the selecting circuit 101 and the reference voltage VREF produced by the reference voltage generator 102.

In view of the foregoing, as the testing apparatus 100 is employed for conducting the test, voltage errors among the output pins of the source driver 104 can be observed by referring to the digital value VAL with use of the digital testing machine 105. The reference voltage VREF of the testing apparatus 100 is generated based on the output voltages outputted from a part of output pins of the under-test source driver 104. Thus, it is not necessary to additionally provide an expensive and accurate analog testing machine for generating the reference voltage with favorable accuracy. Moreover, a precise measurement conducted by the analog testing machine on each output channel of the source driver 104 is not required. As such, the testing apparatus 100 provided by the present embodiment significantly reduces the testing costs of the under-test source driver 104.

Although one embodiment of the testing apparatus 100 has been provided hereinbefore, people skilled in the pertinent art should know that it is not easy to provide an accurate ADC 103. Thus, the following embodiment with respect to the ADC 103 is given hereinafter, such that people skilled in the pertinent art can actually embody the aforesaid testing apparatus 100 proposed in the previous embodiment.

Figure 2:
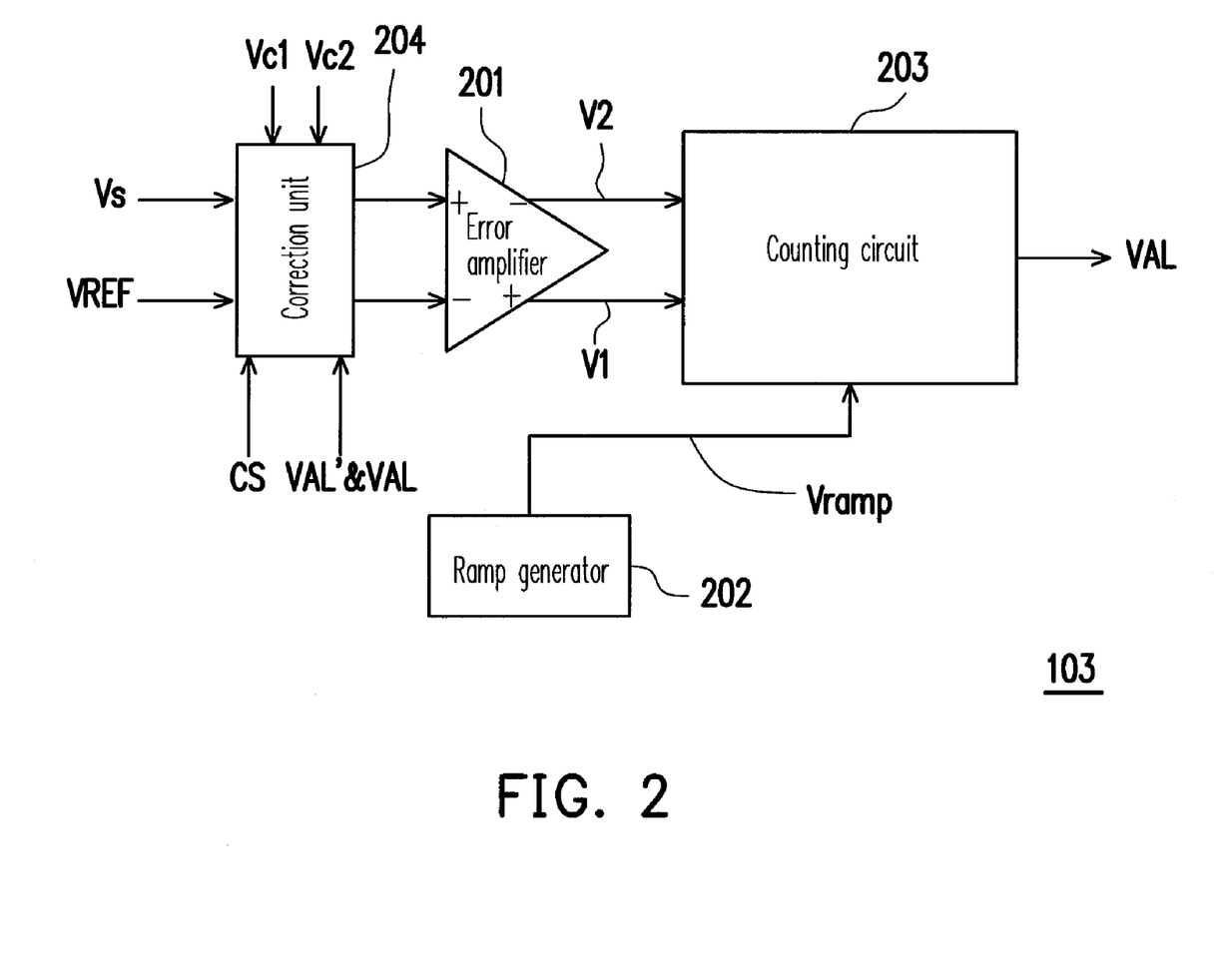
FIG. 2 is a circuit block diagram depicting an ADC according to an embodiment of the present invention.

FIG. 2 is a circuit block diagram depicting the ADC 103 according to an embodiment of the present invention. Referring to FIGS. 1 and 2 together, the ADC 103 includes an error amplifier 201, a ramp generator 202, a counting circuit 203 and a correction unit 204. A positive terminal of the error amplifier 201 receives the output voltage Vs outputted from the output terminal of the selecting circuit 101, while a negative terminal of the error amplifier 201 receives the reference voltage VREF generated by the reference voltage generator 102. Ideally, the voltage outputted from each of the output pins of the source driver 104 may have not a difference if the channels of the source driver 104 receive the same pixel data. Thus, a differential pair signal including a first voltage V1 and a second voltage V2 may be obtained by amplifying the difference between the output voltage Vs and the reference voltage VREF through the error amplifier 201. In addition, the ramp generator 202 of the present embodiment may generate a ramp voltage Vramp which is increased along with time. The ramp voltage Vramp appears in a saw-tooth waveform or in a triangular waveform, for example.

In the present embodiment, the counting circuit 203 starts counting the digital value VAL when the ramp voltage Vramp is larger than or equal to the first voltage V1, whereas the counting circuit 203 stops counting and outputs the digital value VAL when the ramp voltage Vramp is larger than or equal to the second voltage V2. Here, the larger the digital value VAL is, the greater the difference between the output voltage Vs outputted from the output pins of the selecting circuit 101 and the reference voltage VREF is, and the quality of the source driver 104 is unsatisfactory. On the other hand, the smaller the digital value VAL is, the less the difference between the output voltage Vs outputted from the output pins of the selecting circuit 101 and the reference voltage VREF is, and the quality of the source driver 104 is favorable.

Moreover, the correction unit 204 has a correction mode and a test mode, and the correction unit 204 is determined to be in the correction mode or in the test mode based on a control signal CS generated by the digital testing machine 105. A first correction voltage Vc1 and a second correction voltage Vc2 provided by the digital testing machine 105 are received by the correction unit 204 when the correction unit 204 is in the correction mode, and the received first correction voltage Vc1 and the received second correction voltage Vc2 are supplied to the positive terminal and the negative terminal of the error amplifier 201. At this time, the error amplifier 201 amplifies the difference between the first correction voltage Vc1 and the second correction voltage Vc2, so as to obtain the first voltage V1 and the second voltage V2. Thereafter, the correction unit 204 determines whether the ADC 103 is compensated based on the digital value VAL generated by the ADC 103 according to the first correction voltage Vc1 and the second correction voltage Vc2, so as to eliminate errors of the ADC 103 itself.

In the present embodiment, users may define the first correction voltage Vc1 and the second correction voltage Vc2 through the digital testing machine 105. Hence, the values of the first correction voltage Vc1 and the second correction voltage Vc2 are known. Thereby, the digital testing machine 105 would be likely to predict the digital value VAL' corresponding to the known first correction voltage Vc1 and the known second correction voltage Vc2, and then to transmit the predicted digital value VAL' to the correction unit 204. As a result, when the digital value VAL actually generated by the ADC 103 according to the first correction voltage Vc1 and the second correction voltage Vc2 differs from the predicted digital value VAL', the correction unit 204 can be deduced that errors of the ADC 103 may have taken place. At this time, the correction unit 204 compensates the ADC 103, so as to eliminate the errors of the ADC 103 itself.

Note that if the accuracy of the ADC 103 itself is ensured, i.e. no error occurs in the ADC 103, it is not necessary for the ADC 103 to incorporate the correction unit 204.

On the other hand, as the correction unit 204 compensates the ADC 103 for eliminating the errors of the ADC 103, the digital testing machine 105 then again outputs the control signal CS, such that the correction unit 204 is in the test mode. Thereby, the correction unit 204 receives the output voltage Vs outputted from the output terminal of the selecting unit 101 and the reference voltage VREF produced by the reference voltage generator 102, and the correction unit 204 then provides the received output voltage Vs and the received reference voltage VREF to the positive terminal and the negative terminal of the error amplifier 201. As such, the testing apparatus 100 proposed by the present invention is capable of accurately detecting the voltage errors among all the output pins of the source driver 104.

Figure 3A:
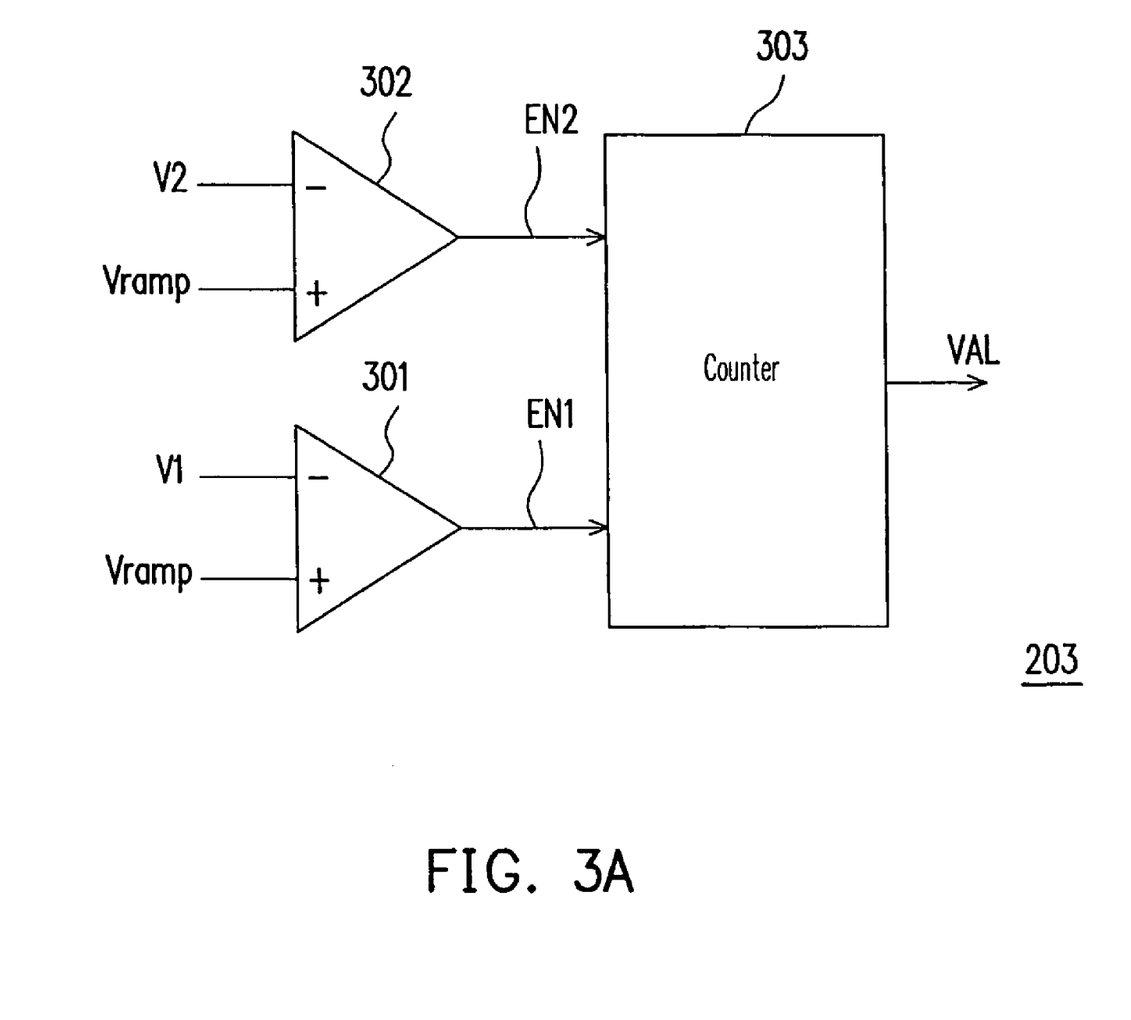
FIGS. 3A and 3B are circuit block diagrams respectively depicting a counting circuit according to an embodiment of the present invention.
Figure 3B:
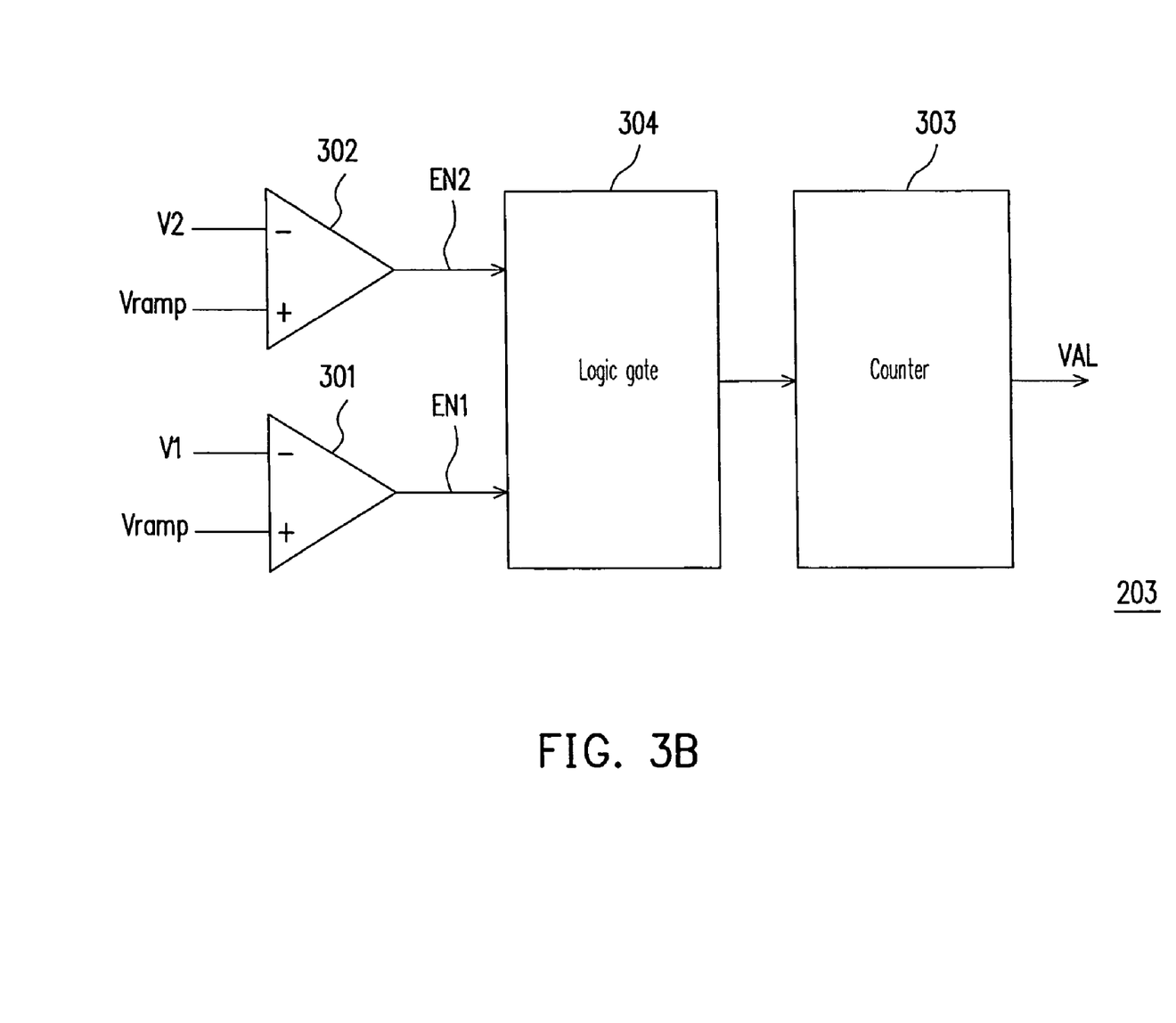

FIGS. 3A and 3B are circuit block diagrams respectively depicting the counting circuit 203 according to an embodiment of the present invention. Referring to FIG. 3A, the counting circuit 203 depicted therein includes a first comparator 301, a second comparator 302 and a counter 303. Here, a positive terminal of the first comparator 301 and a positive terminal of the second comparator 302 receive the ramp voltage Vramp, while a negative terminal of the first comparator 301 and a negative terminal of the second comparator 302 receive the first voltage V1 and the second voltage V2, respectively. Besides, an output terminal of the first comparator 301 and an output terminal of the second comparator 302 respectively output a first enabling signal EN1 and a second enabling signal EN1. Thereby, as the first enabling signal EN1 is enabled, i.e. in a logic-high level, the counter 303 starts counting the digital value VAL. On the contrary, as the second enabling signal EN2 is enabled, the counter 303 stops counting and outputs the digital value VAL.

Next, referring to FIG. 3B, an architecture of the counter 303 disclosed by FIG. 3B is similar to an architecture of the counting circuit 203 disclosed by FIG. 3A, while the difference therebetween lies in that a logic gate 304 is additionally disposed between the counter 303 and the first and the second comparators 301 and 302. According to an operational manner of the counting circuit 203 in FIG. 3A, the logic gate 304 in FIG. 3B should be an XOR gate. As an output of the XOR gate 304 is in the logic-high level, it is indicated that the increasing ramp voltage Vramp exceeds the first voltage V1. At this time, the counter 303 starts counting the digital value VAL. On the contrary, as the output of the XOR gate 304 in the logic-high level is changed to be in a logic-low level, the ramp voltage Vramp is greater than the second voltage V2. Here, the counter 303 stops counting and outputs the digital value VAL.

However, it is known to people skilled in the pertinent art that the logic gate selected to be used may vary when the ramp voltage Vramp and the first and the second voltages V1 and V2 are coupled to different positive terminals and negative terminals of the first comparator 301 and the second comparator 302, and thus the present invention should not be limited by utilizing the exemplary logic gate.

In the present embodiment, it is apparent that the ADC 103 may not be able to perform a rapid analog-to-digital conversion as a regular ADC may be, whereas the analog-to-digital conversion achieved by the ADC 103 of the present invention is relatively accurate. In other words, time is a minor concern because the ADC 103 takes accuracy into major consideration. In light of the above, it can be expected that a circuit dimension of the ADC 103 provided by the present embodiment is miniaturized, and accordingly the manufacturing cost is considerably low.

Figure 4:
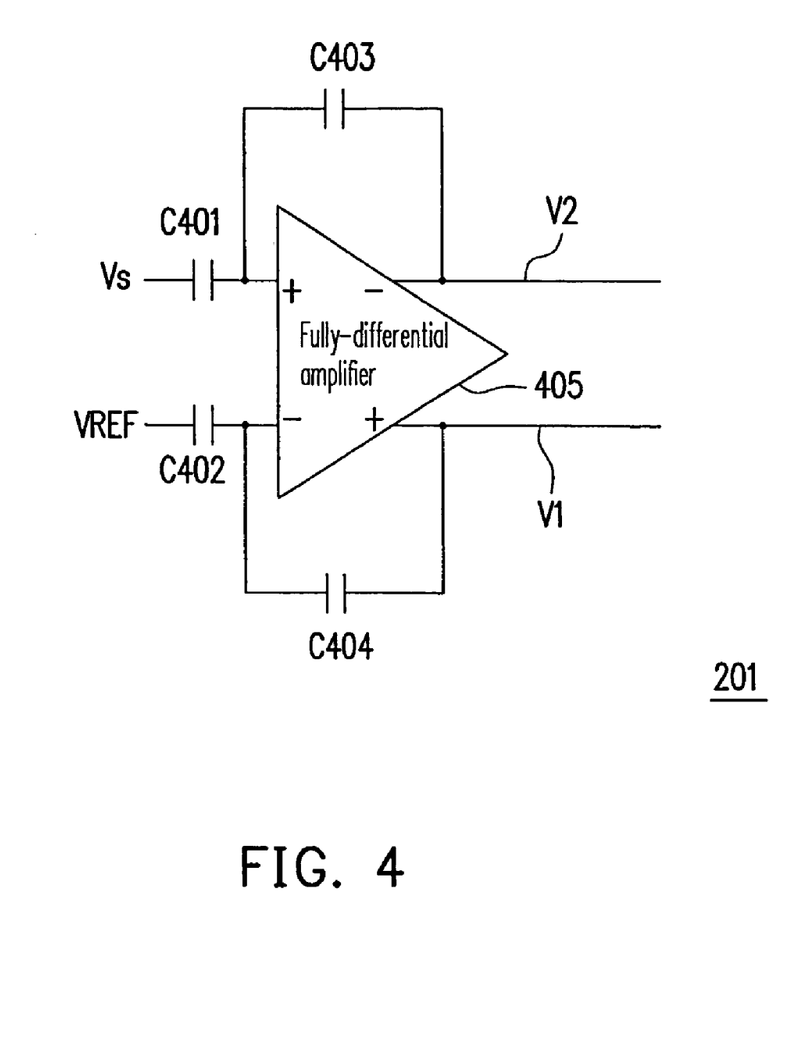
FIG. 4 is a circuit block diagram depicting an error amplifier according to an embodiment of the present invention.

FIG. 4 is a circuit block diagram depicting the error amplifier 201 according to an embodiment of the present invention. Referring to FIG. 4, the error amplifier 201 includes a fully-differential amplifier 405, a first capacitor C401, a second capacitor C402, a third capacitor C403 and a fourth capacitor C404. Here, a terminal of the first capacitor C401 receives the output voltage Vs, while the other terminal thereof is coupled to a positive input terminal of the fully-differential amplifier 405. A terminal of the second capacitor C402 receives the reference voltage VREF, while the other terminal thereof is coupled to a negative input terminal of the fully-differential amplifier 405. The third capacitor C403 is coupled between the positive input terminal of the fully-differential amplifier 405 and a negative output terminal thereof. On the other hand, the fourth capacitor C404 is coupled between the negative input terminal of the fully-differential amplifier 405 and a positive output terminal thereof. Here, the positive output terminal of the fully-differential amplifier 405 and the negative output terminal thereof respectively output the first voltage V1 and the second voltage V2.

Figure 5:
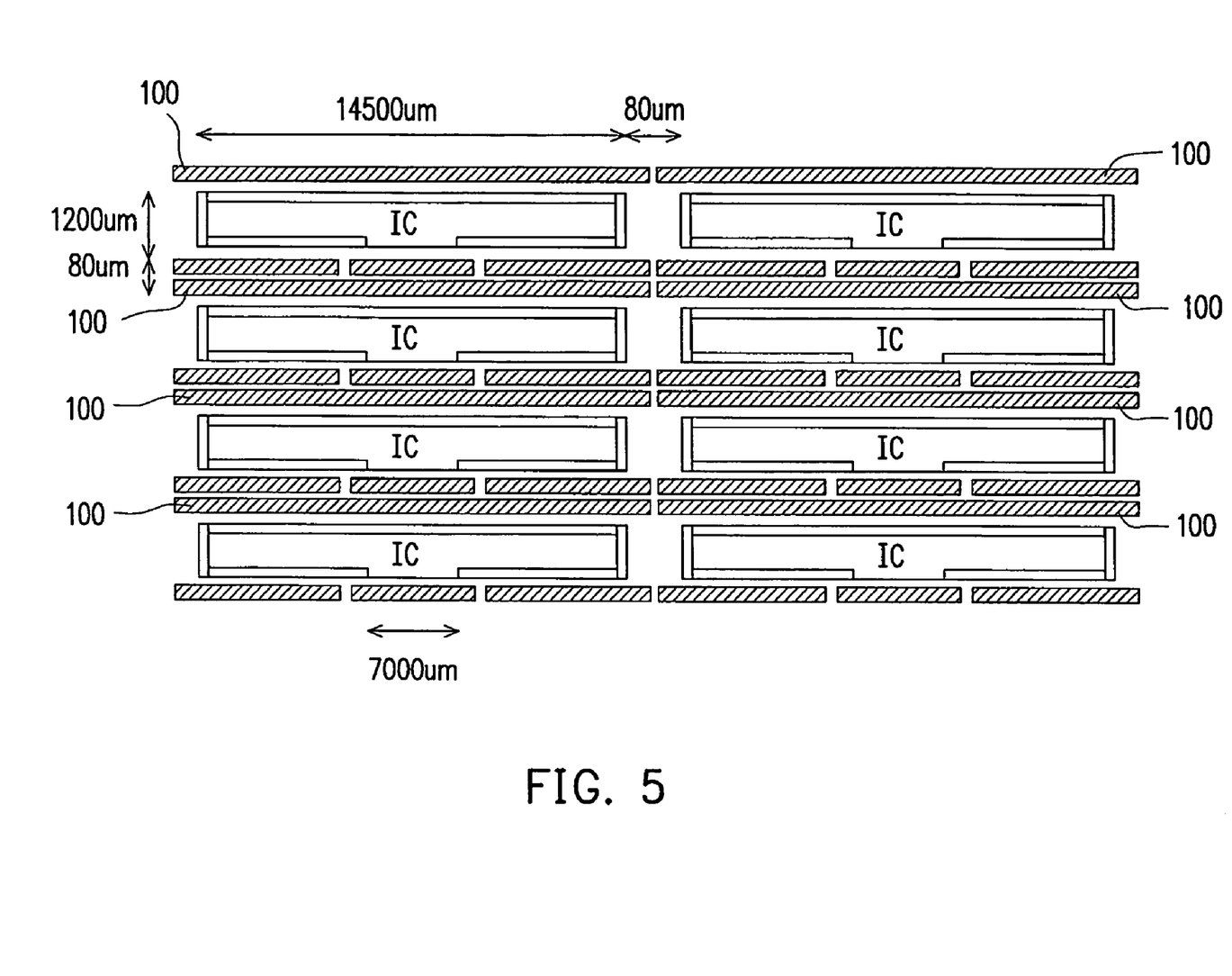
FIG. 5 depicts an arrangement of an apparatus for testing a driving circuit for a display according to an embodiment of the present invention.

FIG. 5 depicts an arrangement of the apparatus for testing the driving circuit for the display according to an embodiment of the present invention. Referring to FIG. 5, according to the above embodiments, the testing apparatus 100 in the present embodiment may be integrated onto a wafer, so as to conduct a built-in self-test. According to the present embodiment, the testing apparatus 100 is disposed on a scribe line around each die. In general, a width of a normal source driving die is approximately 14500 um, while a width of the scribe line is about 80 um. Said dimension is sufficient for the testing apparatus 100 of the present invention to be applied to the wafer, so as to conduct the built-in self-test. Accordingly, as the testing apparatus 100 is tested, the testing apparatus 100 may be cut off when a cutting process is performed on the wafer, and thereby a die area is not increased.

To sum up, at least one of the output pins of the driving circuit is selected by the selecting circuit and is utilized for generating the reference voltage. After that, through the ADC, the digital value is outputted based on the difference between the reference voltage and the output voltage outputted from one of the output pins selected by the selecting circuit. The digital value then serves as a standard for determining whether the test is passed or not. As such, the present invention includes at least the following advantages.

1. The apparatus provided by the present invention is apt to be integrated onto the wafer of the driving circuit for the display for conducting the built-in self-test.

2. The apparatus provided by the present invention is able to directly output the digital value. Thus, the cost of inspecting the ICs can be reduced by not utilizing any expensive analog testing machine.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An apparatus for testing a driving circuit for a display, the apparatus comprising:

a selecting circuit, having a plurality of input terminals and an output terminal, wherein the input terminals are respectively coupled to a plurality of output pins of the driving circuit, and the selecting circuit is used for selecting one of the output pins to electrically connect the output terminal of the selecting circuit;

a reference voltage generator, coupled to at least one of the output pins, for generating a reference voltage; and an analog-to-digital converter (ADC), coupled to the selecting circuit and the reference voltage generator, for outputting a digital value based on a difference between an output voltage outputted from the output terminal of the selecting circuit and the reference voltage.

2. The apparatus of claim 1, wherein the reference voltage generator is further coupled to a first specific pin and a second specific pin in the output pins, for selecting one of the output voltages of the first and the second specific pins as the reference voltage based on polarities of the output voltages of the first and the second specific pins, or for averaging the output voltages of the first and the second specific pins and taking the averaged voltage as the reference voltage.

3. The apparatus of claim 1, wherein the ADC comprises:
an error amplifier, for receiving the output voltage and the reference voltage, and amplifying the difference between the output voltage and the reference voltage, so as to obtain a first voltage and a second voltage;
a ramp generator, for generating a ramp voltage which is increased along with time; and
a counting circuit, for starting counting the digital value when the ramp voltage is larger than or equal to the first voltage, and stopping counting and outputting the digital value when the ramp voltage is larger than or equal to the second voltage.

4. The apparatus of claim 3, wherein the ADC further comprises:
a correction unit, having a correction mode and a test mode, for receiving and providing a first correction voltage and a second correction voltage to the error amplifier when the correction unit is in the correction mode, and then the error amplifier amplifies a difference between the first correction voltage and the second correction voltage, so as to obtain the first voltage and the second voltage,
wherein the correction unit determines whether to compensate the ADC based on the digital value generated by the ADC according to the first correction voltage and the second correction voltage, so as to eliminate errors of the ADC itself.

5. The apparatus of claim 4, wherein the correction unit receives and provides the output voltage and the reference voltage to the error amplifier when the correction unit is in the test mode, and then the error amplifier amplifies the difference between the output voltage and the reference voltage, so as to obtain the first voltage and the second voltage.

6. The apparatus of claim 5, wherein the correction unit is determined to be in the correction mode or in the test mode based on a control signal generated by an external digital testing machine;
wherein while correction unit is in the correction mode, the digital testing machine provides the first correction voltage and the second correction voltage and receives the digital value generated by the ADC according to the first correction voltage and the second correction voltage;
wherein while the correction unit is in the test mode, the digital testing machine receives the digital value generated by the ADC according to the output voltage and the reference voltage.

7. The apparatus of claim 3, wherein the counting circuit comprises:
a first comparator, having a first input terminal, a second input terminal and an output terminal, wherein the first input terminal of the first comparator receives the ramp voltage, the second input terminal of the first comparator receives the first voltage, and the output terminal of the first comparator outputs a first enabling signal when the ramp voltage is larger than or equal to the first voltage;
a second comparator, having a first input terminal, a second input terminal and an output terminal, wherein the first input terminal of the second comparator receives the ramp voltage, the second input terminal of the second comparator receives the second voltage, and the output terminal of the second comparator outputs a second enabling signal when the ramp voltage is larger than or equal to the second voltage; and
a counter, for starting counting the digital value when the first enabling signal is enabled, and stopping counting and outputting the digital value when the second enabling signal is enabled.

8. The apparatus of claim 3, wherein the error amplifier comprises:
a fully-differential amplifier, having a positive input terminal, a negative input terminal, a positive output terminal and a negative output terminal, wherein the positive input terminal of the fully-differential amplifier receives the output voltage, the negative input terminal of the fully-differential amplifier receives the reference voltage, the positive output terminal of the fully-differential amplifier outputs the first voltage, and the negative output terminal of the fully-differential amplifier outputs the second voltage.

9. The apparatus of claim 8, wherein the error amplifier further comprises:
a first capacitor, having a first terminal and a second terminal, wherein the first terminal of the first capacitor receives the output voltage, and the second terminal of the first capacitor is coupled to the positive input terminal of the fully-differential amplifier;
a second capacitor, having a first terminal and a second terminal, wherein the first terminal of the second capacitor receives the reference voltage, and the second terminal of the second capacitor is coupled to the negative input terminal of the fully-differential amplifier;
a third capacitor, coupled between the positive input terminal and the negative output terminal of the fully-differential amplifier; and
a fourth capacitor, coupled between the negative input terminal and positive output terminal of the fully-differential amplifier.

10. The apparatus of claim 1, wherein the apparatus is disposed on a scribe line of a wafer.

* * * * *